(12) United States Patent
Shimada

(10) Patent No.: US 7,105,892 B2
(45) Date of Patent: Sep. 12, 2006

(54) SEMICONDUCTOR DEVICE HAVING A WAVE-LIKE CHANNEL REGION

(75) Inventor: Hiroyuki Shimada, Kofu (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/801,088

(22) Filed: Mar. 15, 2004

(65) Prior Publication Data

US 2004/0222464 A1    Nov. 11, 2004

(30) Foreign Application Priority Data

Mar. 17, 2003    (JP) .............................. 2003-071951

(51) Int. Cl.
*H01L 29/76*    (2006.01)
*H01L 29/94*    (2006.01)
*H01L 31/062*    (2006.01)
*H01L 31/113*    (2006.01)
*H01L 31/119*    (2006.01)

(52) U.S. Cl. ....................... 257/338; 257/369
(58) Field of Classification Search ................ 257/338, 257/347, 350, 351, 368, 369, 288
See application file for complete search history.

(56) References Cited

U.S. PATENT DOCUMENTS

| | | | |
|---|---|---|---|
| 5,665,613 A | | 9/1997 | Nakashima et al. |
| 5,879,978 A | * | 3/1999 | Ra .............................. 438/197 |
| 6,465,823 B1 | | 10/2002 | Yagashita et al. |
| 6,750,515 B1 | * | 6/2004 | Ker et al. .................... 257/357 |
| 2002/0011612 A1 | | 1/2002 | Hidea |

FOREIGN PATENT DOCUMENTS

| | | |
|---|---|---|
| JP | 03-054866 | 3/1991 |
| JP | 04-268767 | 9/1992 |
| JP | 05-075121 | 3/1993 |
| JP | 7-335898 | 12/1995 |
| JP | 03-023011 | 1/1997 |
| JP | 2001-298194 | 10/2001 |

OTHER PUBLICATIONS

Patent Abstracts of Japan regarding Publication No. 09-023011 published Jan. 21, 1997.
Patent Abstracts of Japan regarding Publication No. 2001-298194 published Oct. 26, 2001.

* cited by examiner

*Primary Examiner*—Hoai Pham
(74) *Attorney, Agent, or Firm*—Harness, Dickey & Pierce, P.L.C.

(57) ABSTRACT

A minute semiconductor device having a high driving ability and a manufacturing method thereof are provided. A semiconductor device includes a support substrate, an insulating layer that is formed above the support substrate, a semiconductor layer that is formed above the insulating layer, a channel region that is provided in the semiconductor layer, a source region and a drain region that are formed so as to sandwich the channel region, and a gate electrode that is formed above the channel region via a gate insulating layer. The boundary between the gate insulating layer and the channel region has a wave-like pattern of a gradual slope without any corners.

11 Claims, 5 Drawing Sheets

B—B

C—C

SEMICONDUCTOR DEVICE HAVING A WAVE-LIKE CHANNEL REGION

RELATED APPLICATIONS

This application claims priority to Japanese Patent Application No. 2003-071951 filed Mar. 17, 2003 which is hereby expressly incorporated by reference in its entirety.

BACKGROUND OF THE INVENTION

1. Field of the Invention

The present invention relates to a semiconductor device, and particularly to a semiconductor device that is applicable to an SOI (Silicon On Insulator) structure, and to a manufacturing method thereof.

2. Description of the Related Art

A transistor having a plurality of conductive channels has been known as a minute transistor having a high driving ability. For example, in Japanese Unexamined Patent Application Publication No. 2001-298194, a transistor in which a plurality of conductor channels consisting of semiconductors are arranged in a given direction on an insulator is shown. In the transistor, a plurality of semiconductor layers that form conductive channels (channel regions) are arranged at intervals in a given direction. Each of the semiconductor layers has a rectangle cross section. According to the transistor, a double gate structure is obtained by forming a gate electrode at both sides of each semiconductor layer, which is expected to lead to a high driving ability. However, in the transistor, because the cross section of semiconductor layers forming conductive channels is rectangle, there is a tendency that a gate insulator is damaged due to the concentration of electric fields, which is caused by a partly thinned gate insulating layer at its corner. Also, in the transistor, because channel surface directions change at every corner, changes in the characteristics of the gate insulating layer occur. These changes may considerably affect the reliability of the transistor.

The present invention is intended to provide a minute semiconductor device having a high driving ability and a manufacturing method thereof.

SUMMARY

A semiconductor device of the present invention comprises a semiconductor layer, a source region that is formed in the semiconductor layer, a drain region that is formed in the semiconductor layer, a channel region that is formed in the semiconductor layer between the source region and the drain region, a gate insulating layer that is formed above the channel region, and a gate electrode that is formed above the gate insulating layer. The boundary between the gate insulating layer and the channel region is a wave-like pattern having a gradual slope. That is, the boundary smoothly undulates.

A semiconductor device comprises a semiconductor layer, a source region that is formed in the semiconductor layer, a drain region that is formed in the semiconductor layer, a channel region that is formed in the semiconductor layer between the source region and the drain region, a gate insulating layer that is formed above the channel region, and a gate electrode that is formed above the gate insulating layer. The boundary between the gate insulating layer and the channel region is a wave-like pattern without any corners. That is, the boundary undulates in a wavy, curving or arcuate pattern.

According to a semiconductor device of the present invention, the boundary between the gate insulating layer and the semiconductor layer, in which the channel region is formed, is a wave-like pattern.

Here, the wave-like pattern means a shape like a sine curve (sinusoidal), and its boundary is a gradual slope. In addition, the wave-like pattern may mean a smoothly transitioning sinusoidal pattern without any corners (e.g., as normally found in rectangles and triangles).

Because the boundary between the gate insulating layer and the semiconductor layer, in which the channel region is formed, is a wave-like pattern, the structure of the gate electrode has a quasi-double gate (Fin-FET) structure. As a result, the semiconductor device of the present invention makes the gate length short while thoroughly reducing short-channel effects. Therefore, it is possible to provide a minute transistor with a high driving ability.

Moreover, because the boundary between the gate insulating layer and the semiconductor layer, in which the channel region is formed, has no corners, the gate insulating layer is prevented from being damaged by the concentration of electric fields. Further, there is no change in channel surface directions, and thereby changes in characteristics of a gate insulating layer are reduced.

In addition, in the semiconductor device of the present invention, the surface of the semiconductor layer, in which the channel region is formed, is patterned so as to have a wave-like pattern, it is not necessary to manufacture the gate insulating layer in a particular pattern for reducing the concentration of electric fields.

A method of manufacturing a semiconductor device comprises the steps of: forming a semiconductor layer above a support substrate via an insulating layer, forming a mask layer having a plurality of openings at predetermined intervals above the semiconductor layer, forming a waveform oxide layer with a pattern of a gradual slope by the process in which the semiconductor layer is heat-treated in an oxygen environment and selectively oxidized, removing the mask layer, removing the oxide layer, forming a gate insulating layer above the semiconductor layer, forming a gate electrode above the gate insulating layer, and forming a source region and a drain region by doping an impurity into the semiconductor layer, with the gate electrode as a mask.

According to a manufacturing method of the present invention, the boundary between the gate insulating layer and the channel region can be structured to have a wave-like pattern by a comparatively easy method of selective oxidization.

DETAILED DESCRIPTION

A preferred embodiment of the present invention is described referring to the figures.

1. Semiconductor Device

Figure 1:
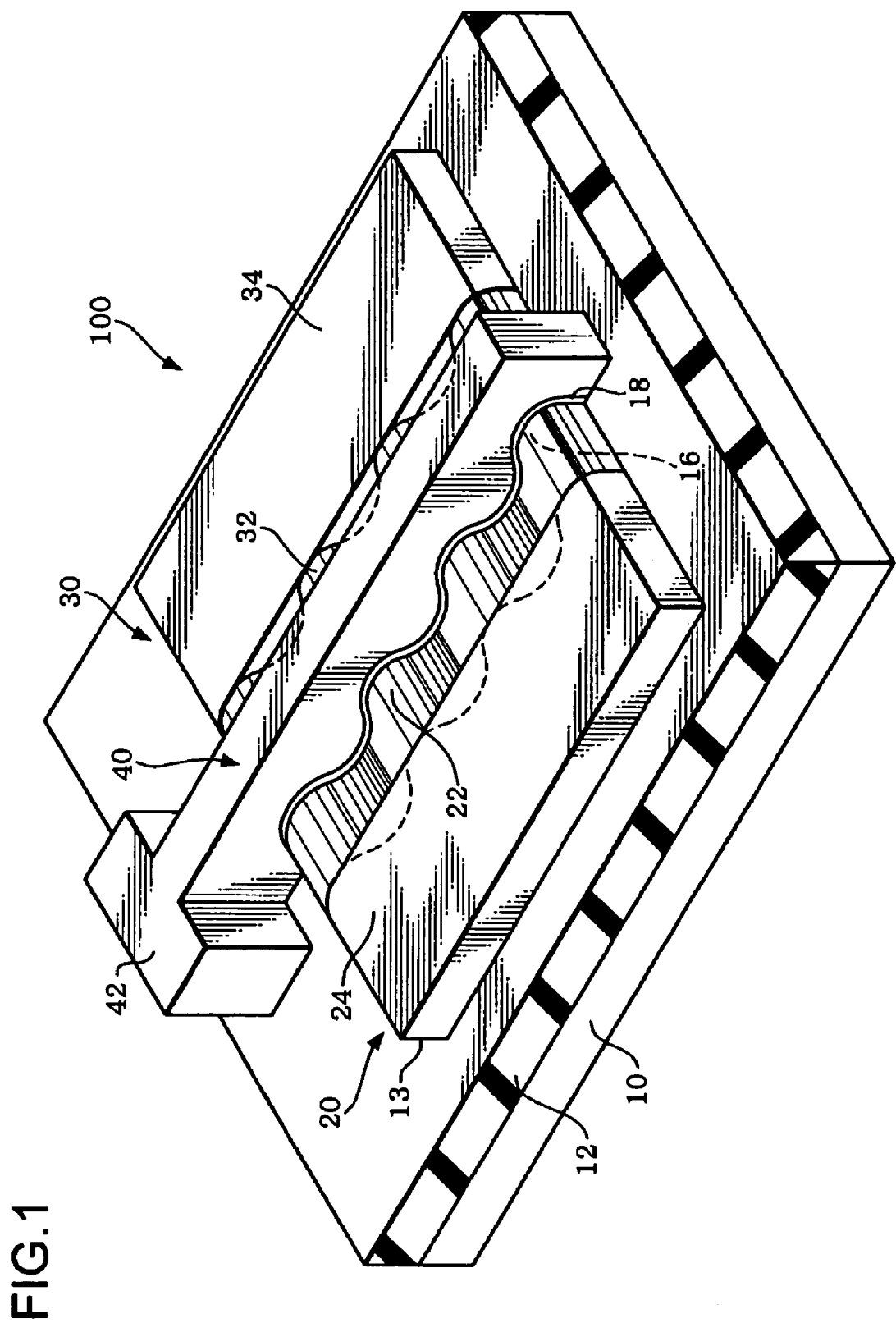
FIG. 1 is a perspective view showing a semiconductor device according to an embodiment of the present invention
Figure 2:
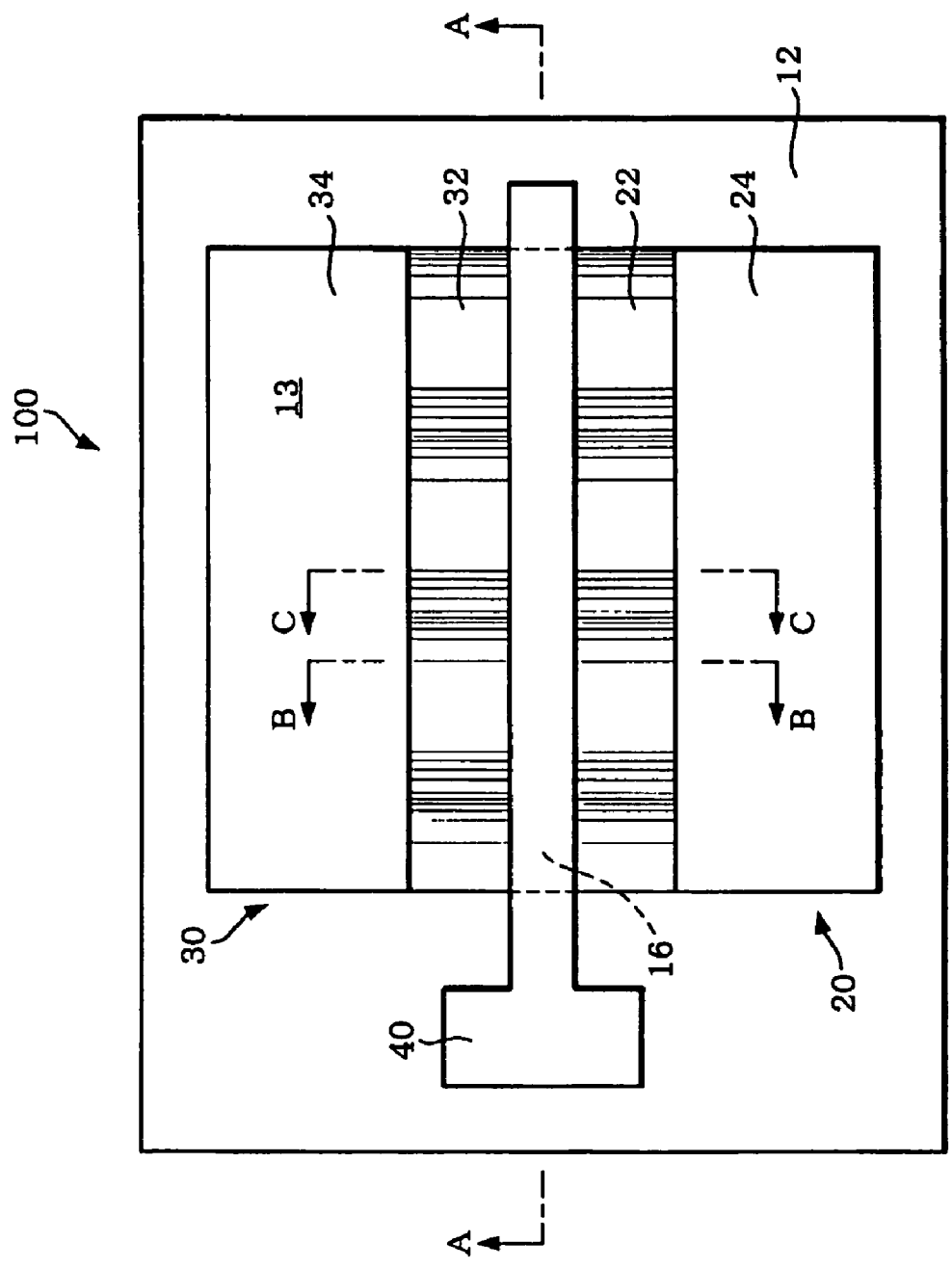
FIG. 2 is a plan view showing the semiconductor device according to the embodiment of the present invention
Figure 3:
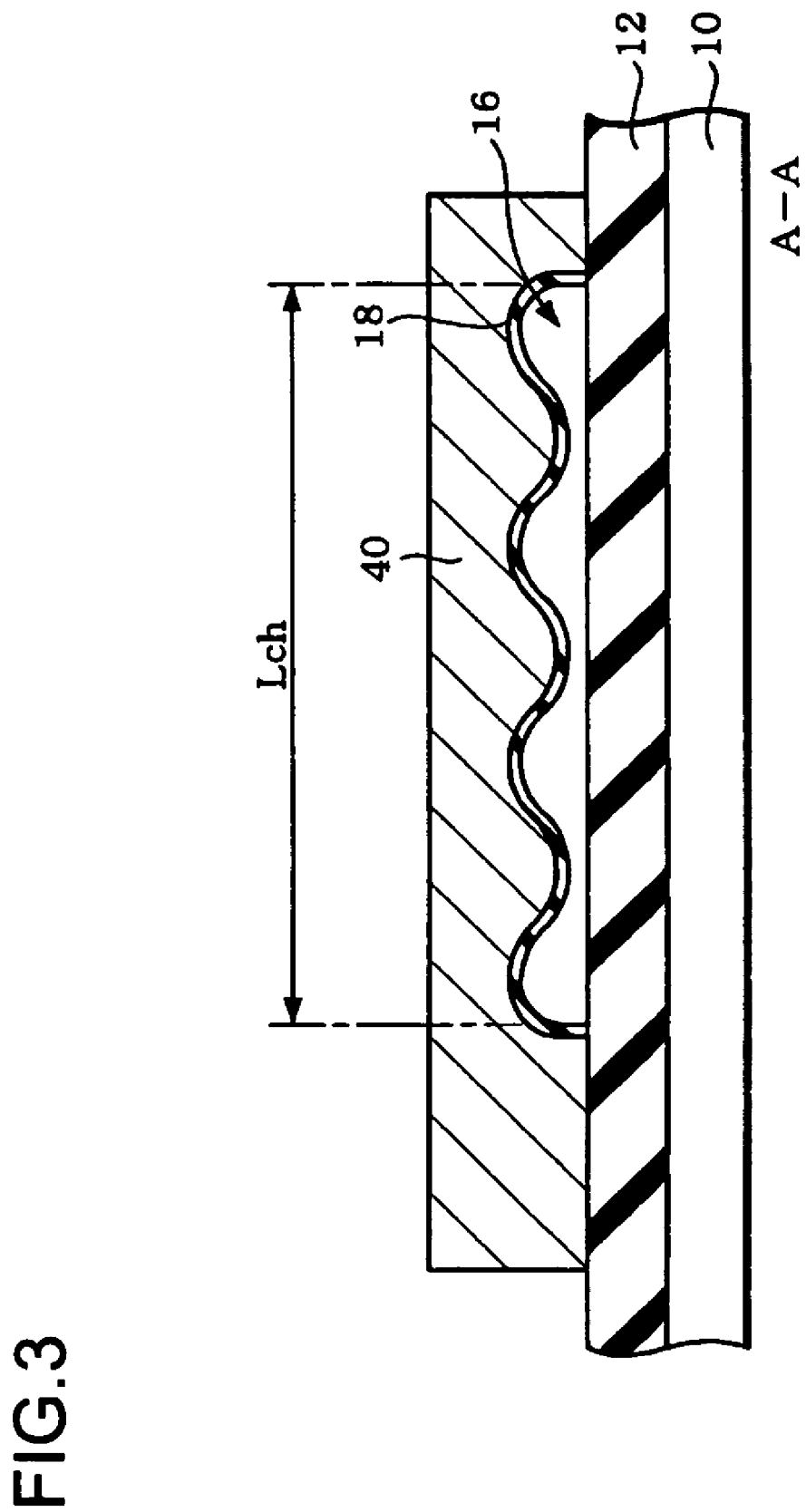
FIG. 3 is a sectional view showing the semiconductor device along the line A—A in FIG. 2
Figure 4:
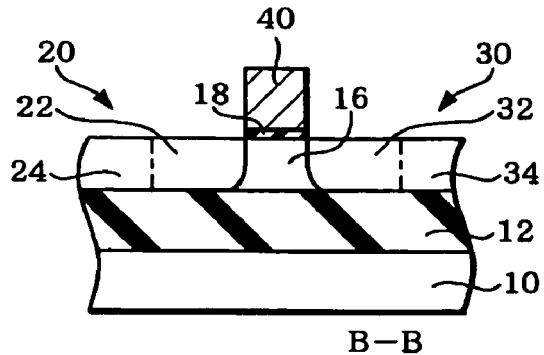
FIG. 4 is a sectional view showing the semiconductor device along the line B—B in FIG. 2
Figure 5:
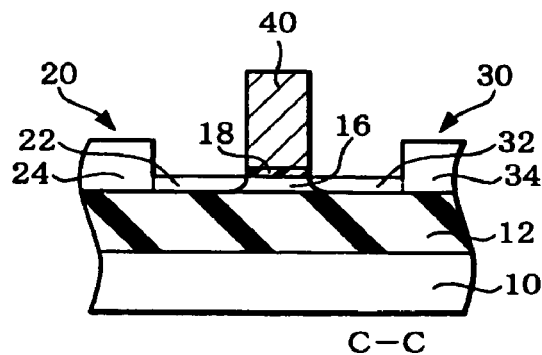
FIG. 5 is a sectional view showing the semiconductor device along the line C—C in FIG. 2

FIG. 1 is a perspective view showing a semiconductor device 100 according to one embodiment of the present invention. FIG. 2 is a plan view of the semiconductor device 100. FIGS. 3, 4, and 5 are sectional views showing the semiconductor device along the lines A—A, B—B, and C—C, respectively, indicated in FIG. 2.

As shown in FIG. 1 and FIG. 2, the semiconductor device 100 has an SOI substrate. The SOI substrate includes a support substrate 10, a buried insulating layer 12 which is formed above (on) the support substrate 10, and a semiconductor layer 13 which is formed above (on) the buried insulating layer 12. The buried insulating layer 12 is made of a silicon oxide layer. The semiconductor layer 13 is made of a silicon layer. In the semiconductor layer 13, a channel region 16, a source region 20 and a drain region 30 are formed. The source region 20 and the drain region 30 are formed so as to sandwich the channel region 16.

As shown in FIG. 3, the upper surface of the semiconductor layer 13, in which the channel region 16 is formed, has a wave-like pattern. In other words, the upper surface of the semiconductor layer 13 undulates through curved peaks and troughs. Therefore, the boundary between a gate insulating layer and the semiconductor layer, in which the channel region is formed, is also a wave-like pattern.

In this case, a "wave-like pattern" means a shape like a sine curve (e.g., sinusoidal), which is a pattern of a gradual (e.g., smooth) slope. In addition, the wave-like pattern may mean a smoothly transitioning or undulating pattern without any (sharp) corners.

In the channel region 16, the pitch between the top (peak) and the nearest (adjacent) bottom (trough) of the wave-like pattern is preferably no more than 50 nm.

No impurity is doped into the channel region 16, or an impurity whose concentration is lower than that of the source region 20 and the drain region 30 is doped into the channel region 16. By applying a predetermined gate voltage to the channel region 16, a channel is formed in the channel region 16.

As shown in FIG. 4 and FIG. 5, the source region 20 and the drain region 30 are formed so as to sandwich the channel region 16. An N-type or P-type impurity is doped into the source region 20 and into the drain region 30.

The source region 20 includes a region 22 which is next to the channel region 16, and a region 24 which is outboard the region 22 relative to the channel region 16. The upper surface of the region 22 is processed in the same stage as the processing of the upper surface of the semiconductor layer 13, in which the channel region 16 is formed. As a result, the upper surface of the region 22 has a wave-like pattern as the upper surface of the channel region 16 has. Therefore, as shown in FIG. 4, the upper surface of the region 22 is as high as the highest points of the channel region 16 along the line B—B in FIG. 2. In other words, the upper surface of the region 22 is as high as the highest parts of the wave-like pattern (the top of the wave). Also, as shown in FIG. 5, the upper surface of the region 22 is as low as the lowest points of the channel region 16 along the line C—C in FIG. 2. In other words, the upper surface of the region 22 is as low as the lowest parts of the wave-like pattern (the bottom of the wave). Accordingly, the lowest portions of the channel region 16 have an SOI structure in which the semiconductor layer is very thin, as shown in FIG. 5. On the other, the upper surface of the region 24 is flat. The contact between the source region 20 and a source wire can be easily established above the region 24.

Similarly, the drain region 30 includes a region 32 which is next to the channel region 16, and a region 34 which is outboard the region 32 relative to the channel region 16. The upper surface of the region 32 is processed in the same stage as the processing of the semiconductor layer 13, in which the upper surface of the channel region 16 is formed. As a result, the upper surface of the region 32 has a wave-like pattern as the upper surface of the channel region 16 has. Therefore, as shown in FIG. 4, the upper surface of the region 32 is as high as the highest points of the channel region 16 along the line B—B in FIG. 4. In other words, the upper surface of the region 32 is as high as the highest points of the wave-like pattern (the top of the wave). Also, as shown in FIG. 5, the upper surface of the region 32 is as low as the lowest points of the channel region 16 along the line C—C in FIG. 5. In other words, the upper surface of the region 32 is as low as the lowest parts of the wave-like pattern (the bottom of the wave). Accordingly, the lowest portions of the channel region 16 have an SOI structure in which the semiconductor layer is very thin, as shown in FIG. 5. On the other hand, the upper surface of the region 34 is flat. The contact between the drain region 30 and a drain wire can be easily established above the region 34.

A gate insulating layer 18 is formed above the channel region 16. In other words, the gate insulating layer is formed above the semiconductor layer 13, in which the channel region 16 is formed. Since the gate insulating layer 18 is formed above and along the upper surface of the channel region 16, the gate insulating layer 18 has a wave-like pattern. Thus the boundary between the gate insulating layer 18 and the channel region 16 also has a wave-like pattern. The gate insulating layer 18 can be made of such metal oxides as Hf, Zr, Al and so on, or silicon oxide.

A gate electrode 40 is formed above the gate insulating layer 18. Accordingly, the lower surface of the gate electrode 40 has a wave-like pattern. Therefore, in the semiconductor device according to the embodiment, the highest portions of the channel region 16 have a quasi-double-gate (Fin-FET) structure as shown in FIG. 3.

The gate electrode 40 has a terminal area 42 for contacting its terminal. Metal materials selected from transition metals such as Ta, W, Mo, Cr, Zr, Hf and so on, or polycrystal silicon can be used for the gate electrode 40. For example, a tantalum nitride layer or a tantalum layer (preferably, of a body-centered cubic lattice layer) can be used for the gate electrode 40. Alternatively, a multilayered structure of tantalum nitride layers as cap layers can be used.

The semiconductor device according to the embodiment of the present invention has the following main characteristics.

According to the embodiment of the present invention, the upper surface of the channel region 16 has a wave-like pattern, along which the channel is formed. As a result, the effective width of the channel is wider than the width of the channel region 16 (indicated as "Lch" in FIG. 3). Therefore, it is possible to increase a current driving ability while thoroughly reducing short-channel effects. Also, according to the structure, the channel region 16 is made completely depleted. Therefore, a minute MOS transistor whose gate length is about 10 nm can be provided. Thus, with the semiconductor device according to the embodiment of the present invention, it is possible to provide a minute MOS transistor that has a high driving ability.

Also, in the semiconductor device according to the embodiment of the present invention, the boundary between the gate insulating layer 18 and the channel region 16 is a wave-like pattern, which is a pattern having a gradual (e.g., smooth) slope. If the cross-section pattern of the semiconductor layer, in which the channel region is formed, is a rectangle, triangle or V-letter pattern, the concentration of electric fields can easily happen due to a partly thinned gate insulating layer (at the corners). The semiconductor device according to the embodiment, however, has no corners (i.e., as occur at the vertices of rectangular or triangular configurations) in the boundary between the gate insulating layer 18 and the channel region 16, and causes no damage to a gate insulator.

Moreover, in the semiconductor device according to one embodiment of the present invention, since the boundary between the gate insulating layer 18 and the channel region 16 is a wave-like pattern, it is possible to prevent the characteristics of the gate insulating layer from being considerably changed. If the channel region has a rectangle cross section, the characteristics are considerably changed due to the corners of the rectangle.

Furthermore, in the semiconductor device according to the embodiment of the present invention, the upper surface of the channel region 16 itself is formed in a wave-like pattern. If the gate insulating layer formed above the channel region is formed in a round structure in order to alleviate the concentration of electric fields, the manufacturing process will become complicated. Actually, it is not easy to control the layer thickness of the gate insulating layer as for each surface of the silicon layer. In the semiconductor device according to an embodiment of the present invention, the surface of the silicon layer is formed to have a rounded pattern, and thereby changes in surface directions are reduced. Therefore, the gate insulating layer formed above the silicon layer can be optimized by a simple manufacturing process.

2. Manufacturing Method of a Semiconductor Device

The following is an example of a manufacturing method of the semiconductor device according to the embodiment of the present invention. Referring to FIGS. 6 through 10, each figure mainly shows the channel region (the region along the line A—A in FIG. 2).

Figure 6:
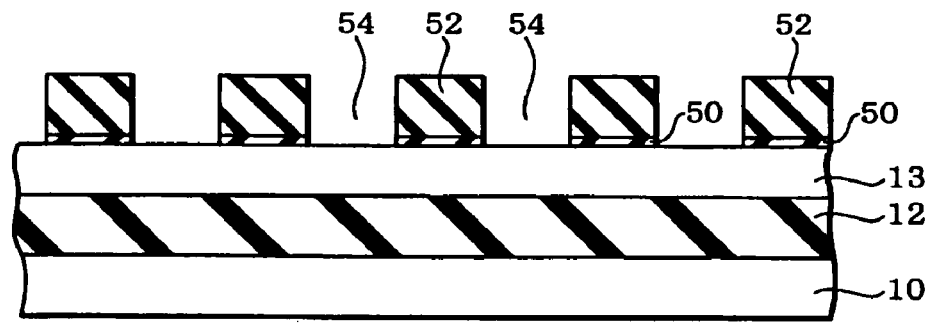
FIG. 6 is a sectional view showing a manufacturing method for the semiconductor device according to an embodiment of the present invention.

First, as shown in FIG. 6, an SOI substrate is provided above the supporting substrate 10. The SOI substrate includes the buried insulating layer 12 and the silicon layer 13 (referred to as "semiconductor layer" hereafter) with a predetermined thickness, 20 nm, for example. A silicon oxide layer and a silicon nitride layer are formed on the semiconductor layer 13 by heat-oxidization. Then, a resist layer is formed, which is not shown in figure, the silicon nitride layer and the silicon oxide layer are patterned by lithography and anisotropic etching. Through these process steps, a pad layer 50 made of silicon oxide and a mask layer 52 made of silicon nitride are formed. Consequently, an opening 54 where the semiconductor layer 13 is exposed in a predetermined distance to one another, 20 nm for example, is formed. Then, the resist layer is removed.

Figure 7:
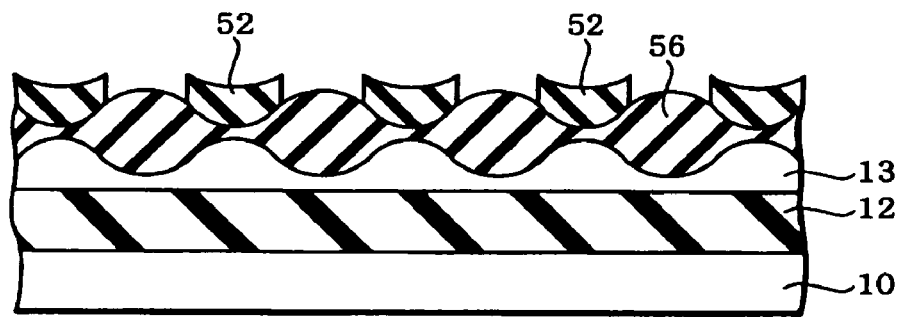
FIG. 7 is a sectional view showing the manufacturing method for the semiconductor device according to an embodiment of the present invention.

As shown in FIG. 7, a silicon oxide layer 56 is formed through the process in which the surface of the semiconductor layer 13 is heat-treated in an oxygen environment and selectively oxidized. The thickness of the silicon oxide layer 56 becomes thin in the region with the mask layer 52, while it becomes thick in the region without the mask layer 52. As a result, the surface of the silicon oxide layer 56 has a wave-like pattern. It is possible to control the curvature of the surface of silicon oxide layer 56 and the pitch of wave by selecting the pitch and the width of the mask layer 52.

Figure 8:
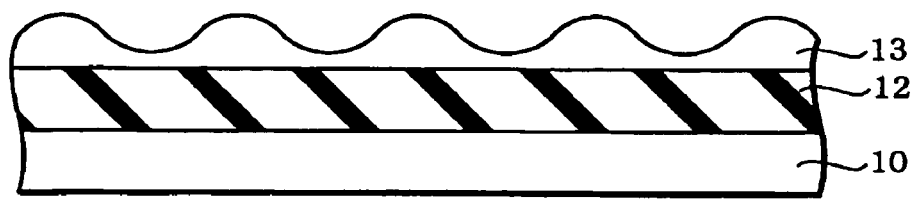
FIG. 8 is a sectional view showing the manufacturing method for the semiconductor device according to an embodiment of the present invention.

As shown in FIG. 8, the mask layer 52 and the silicon oxide layer 56 are removed by etching, for example. Through this process, the upper surface of the semiconductor layer 13 becomes a wave-like pattern of a gradual slope without any corners.

Figure 9:
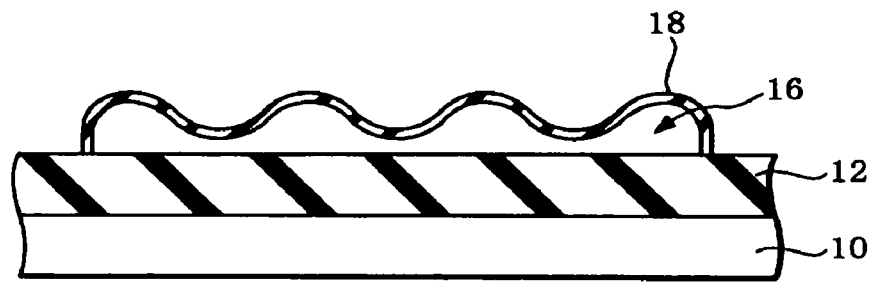
FIG. 9 is a sectional view showing the manufacturing method for the semiconductor device according to an embodiment of the present invention.

As shown in FIG. 9, the channel region 16, the source region 20 and the drain region 30 are formed by patterning the semiconductor layer 13 by means of lithography and etching. If an impurity is doped into the channel region 16, a predetermined amount of an impurity is doped by ion plantation before pattering.

Next, an insulating layer is formed on the surface of the semiconductor layer 13 that is patterned. Through this process, the gate insulating layer 18 is formed on the surface of the channel region 16, as shown in FIG. 9. The materials mentioned above can be used for the gate insulating layer 18. For example, the gate insulating layer 18 is formed by the CVD method when using such metal oxides as Hf, Zr, Al and so on, or by thermal oxidation when using silicon oxide.

Figure 10:
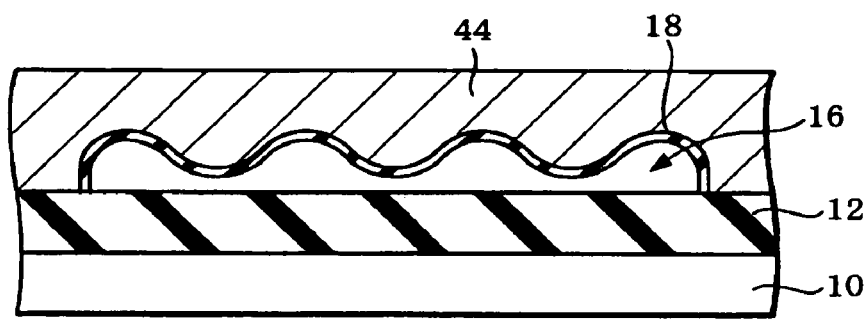
FIG. 10 is a cross-sectional view showing the manufacturing method for the semiconductor device according to an embodiment of the present invention.

As shown in FIG. 10, a conductive layer 44 is formed so as to cover the patterned semiconductor layer. Next, the gate electrode 40 is formed by patterning the conductive layer 44 by means of lithography and etching. The metals mentioned above or polycrystal silicon can be used for the gate electrode 40.

As shown in FIG. 1 and FIG. 2, the source region 20 and the drain region 30 are formed by doping an impurity into the semiconductor layer 13 by ion plantation, with the gate electrode 40 as a mask.

The semiconductor device according to the embodiment of the present invention can be provided through the manufacturing process described above. The manufacturing method has the following features.

According to the manufacturing process according to the above embodiment of the present invention, the upper surface of the channel region 16 can be made to have a wave-like pattern by a comparatively easy method of selective oxidization.

What is claimed is:

1. A semiconductor device comprising:
   a support base;
   an insulating layer formed on the support base;
   a semiconductor layer formed on the insulating layer;
   a source region formed in the semiconductor layer;
   a drain region formed in the semiconductor layer;
   a channel region formed between the source region and the drain region in the semiconductor layer;
   a gate insulating layer formed above the channel region; and
   a gate electrode formed above the gate insulating layer, the gate electrode having a major axis and a minor axis and first and second ends that are spaced apart along the major axis, overlap the semiconductor layer, and are in contact with the insulating layer;
   wherein a boundary between the gate insulating layer and the channel region is a wave-like pattern of a gradual slope having crests and troughs alternately spaced apart along the major axis of the gate electrode.

2. The semiconductor device according to claim 1, wherein a pitch between a top of the wave-like pattern and an adjacent bottom of the wave-like pattern in the boundary is less than or equal to 50 nm.

3. The semiconductor device according to claim 1, wherein a part of an upper surface of the source region is flat.

4. The semiconductor device according to claim 3, wherein a part of an upper surface of the drain region is flat.

5. A semiconductor device comprising:
a support base;
an insulating layer formed on the support base;
a semiconductor layer formed on the insulating layer;
a source region formed in the semiconductor layer;
a drain region formed in the semiconductor layer;
a channel region formed between the source region and the drain region in the semiconductor layer;
a gate insulating layer formed above the channel region; and
a gate electrode formed above the gate insulating layer, the gate electrode having a major axis and a minor axis and first and second ends that are spaced apart along the major axis, overlap the semiconductor layer, and are in contact with the insulating layer;
wherein a boundary between the gate insulating layer and the channel region is a wave-like pattern without any corners, the wave-like pattern having crests and troughs alternately spaced apart along the major axis of the gate electrode.

6. The semiconductor device according to claim 5, wherein a pitch between a top of the wave-like pattern and an adjacent bottom of the wave-like pattern in the boundary is less than or equal to 50 nm.

7. The semiconductor device according to claim 5, wherein a part of an upper surface of the source region is flat.

8. The semiconductor device according to claim 7, wherein a part of an upper surface of the drain region is flat.

9. A semiconductor device comprising:
a support base;
an insulating layer formed on the support base;
a semiconductor layer formed on the insulating layer;
a source region formed in the semiconductor layer;
a drain region formed in the semiconductor layer;
a channel region formed between the source region and the drain region in the semiconductor layer;
a gate insulating layer formed above the channel region; and
a gate electrode formed above the gate insulating layer, the gate electrode having a major axis and a minor axis and first and second ends that are spaced apart along the major axis, overlap the semiconductor layer, and are in contact with the insulating layer;
wherein a boundary between the gate insulating layer and the channel region undulates and includes crests and troughs alternately spaced apart along the major axis of the gate electrode.

10. The semiconductor device according to claim 9 wherein said boundary undulates in a sinusoidal pattern.

11. The semiconductor device according to claim 9 wherein said boundary undulates in a curving pattern.

* * * * *